(12) United States Patent
Tower et al.

(10) Patent No.: US 11,464,130 B2
(45) Date of Patent: Oct. 4, 2022

(54) CABLE MANAGEMENT ARM EXTENSION

(71) Applicant: HEWLETT PACKARD ENTERPRISE DEVELOPMENT LP, Houston, TX (US)

(72) Inventors: Daniel W. Tower, Houston, TX (US); Kevin Bold, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/527,300

(22) Filed: Jul. 31, 2019

(65) Prior Publication Data
US 2021/0037672 A1    Feb. 4, 2021

(51) Int. Cl.
| H05K 7/14 | (2006.01) |
| H02G 3/04 | (2006.01) |
| H05K 7/18 | (2006.01) |

(52) U.S. Cl.
CPC ......... H05K 7/1491 (2013.01); H02G 3/0456 (2013.01); H05K 7/183 (2013.01)

(58) Field of Classification Search
CPC ..... H05K 7/1491; H05K 7/183; H02G 3/0456
USPC .................. 248/274.1, 49, 60, 68.1, 74.3
See application file for complete search history.

(56) References Cited

U.S. PATENT DOCUMENTS

| 5,816,543 | A | * | 10/1998 | Kraus | ...................... | F16L 3/137 |
| | | | | | | 248/74.1 |
| 6,715,718 | B1 | | 4/2004 | Chen et al. | | |
| 8,251,321 | B2 | | 8/2012 | Chen et al. | | |
| 9,072,190 | B2 | | 6/2015 | Chen et al. | | |
| 9,072,194 | B2 | | 6/2015 | Chen et al. | | |
| 9,144,174 | B2 | * | 9/2015 | Chen | .................... | H05K 7/1491 |
| 9,167,717 | B2 | | 10/2015 | Chen et al. | | |
| 9,383,038 | B2 | | 7/2016 | Chen et al. | | |
| 9,867,311 | B2 | * | 1/2018 | Chen | ...................... | F16L 3/015 |
| 10,117,351 | B2 | | 10/2018 | Chen | | |
| 10,225,945 | B2 | | 3/2019 | Chen et al. | | |
| 10,247,330 | B2 | * | 4/2019 | Hargrave | .............. | F16L 55/035 |
| 10,638,636 | B1 | | 4/2020 | Chen et al. | | |
| 10,709,033 | B2 | * | 7/2020 | Chen | .................... | H05K 7/1491 |
| 2013/0034334 | A1 | * | 2/2013 | Fariello | ................ | H05K 7/1491 |
| | | | | | | 248/274.1 |
| 2013/0140408 | A1 | | 6/2013 | Chen et al. | | |

(Continued)

FOREIGN PATENT DOCUMENTS

| CN | 105430984 A | 3/2016 |
| EP | 2632240 B1 | 8/2016 |

(Continued)

OTHER PUBLICATIONS ebay.com, "Intel A1ufullrail 1u Premium Quality Rails with CMA Support," (Web Page), retrieved online Feb. 28, 2019, https://www.ebay.com/itm/Intel-A1UFULLRAIL-1U-Premium-Quality-Rails-with-CMA-Support-/192236245346.

(Continued)

*Primary Examiner* — Muhammad Ijaz
(74) *Attorney, Agent, or Firm* — Hewlett Packard Enterprise Patent Department

(57) ABSTRACT

A cable management arm extension, comprising: a plate including apertures to allow for mounting a cable retainer; a first hinged section to connect to a first section of a cable management arm and to a first side of the plate; and a second hinged section to connect to a second section of a cable management arm and to a second of the plate.

18 Claims, 12 Drawing Sheets

(56) References Cited

U.S. PATENT DOCUMENTS

| | | | | |
|---|---|---|---|---|
| 2014/0183306 A1* | 7/2014 | Chen | ................... | H05K 7/1421 |
| | | | | 248/70 |
| 2016/0161026 A1* | 6/2016 | Chen | ................... | H05K 7/1491 |
| | | | | 248/70 |
| 2017/0034944 A1* | 2/2017 | Amdahl | ............... | H05K 7/1491 |
| 2019/0053396 A1 | 2/2019 | Chen et al. | | |
| 2020/0029457 A1* | 1/2020 | Chen | ................... | H05K 7/1491 |

FOREIGN PATENT DOCUMENTS

| | | | |
|---|---|---|---|
| EP | 3076774 | B1 | 10/2018 |
| GB | 2392081 | B | 12/2005 |

OTHER PUBLICATIONS

Oracle, "Install the Cable Management Arm," (Web Page), Jul. 2018, https://docs.oracle.com/cd/E41033_01/html/E55032/z40000151427029.html.

* cited by examiner

CABLE MANAGEMENT ARM EXTENSION

BACKGROUND

Cable management arm designs do not include a support. In other words, the cable management arm is not physically supported, other than at the point where the cable management arm attaches to a rail kit, when a computing device is extended or pulled from a rack. Some computing device designs may utilize longer and heavier cables, in part due to the extra length of the computing device design and the extra distance that the computing device may be extended from a rack. The additional weight and length of the cables is too much for a cable management arm without additional support.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

Figure 1:
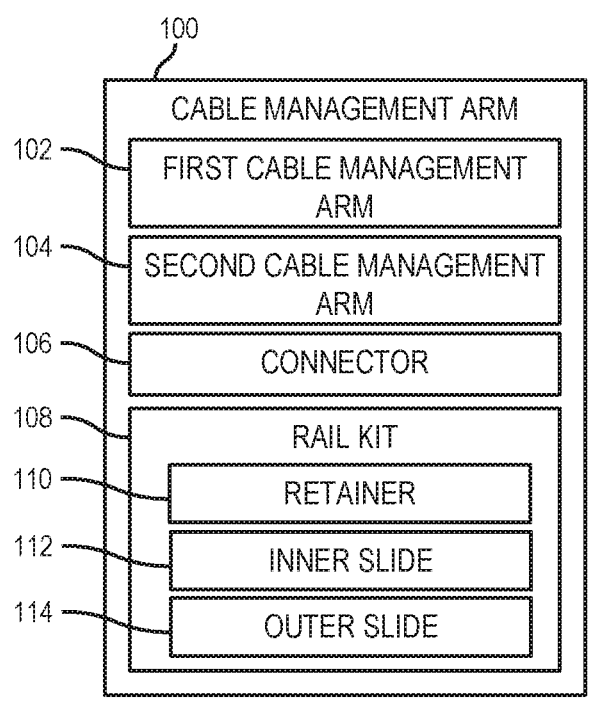
FIG. 1 is a block diagram of a cable management arm, according to an example.

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Computing devices, particularly servers, may be added to or installed in a rack, A rack may be a structure for housing multiple computing devices, Generally, a rack may consist of four posts or columns with mounting holes or apertures to facilitate the addition or mounting of computing devices. A rail kit may attach to a computing device and to a rack, thus allowing a computing device to be mounted to the rack. Further, the rail kit may allow the computing device to be slid in and out of the rack while remaining mounted to the rack, thus providing access to a user for a portion of the computing device. The rail kit may be formed to support a certain weight, based on past models of computing devices. A cable management arm may refer to a support structure located at the rear of a computing device. In an example, the cable management arm may attach to one of two rail kits attached to the computing device. The cable management arm may support the cables connected to a computing device as a computing device is pulled forward, pushed inward, in an extended position, and in a retracted position.

Cable management arm designs do not include a support. In other words, the cable management arm is not physically supported, other than at the point where the cable management arm attaches to a rail kit, when a computing device is extended or pulled from a rack. Some computing device designs may utilize longer and heavier cables, in part due to the extra length of the computing device design and the extra distance that the computing device may be extended from a rack. The additional weight and length of the cables is too much for a cable management arm without additional support.

Based on the issues described above, a support may be added underneath the cable management arm to add support. In an example, the support may be a rail kit or some other similar friction slide component, ball bearing component, other type of slide components, or some combination thereof. In an example, a rail kit (e.g., a friction slide support) for the cable management arm may be attached (for example, pivotally connected) to one side of a connector on the rail kit of the computing device (for example, the opposite rail kit of the computing device which the cable management arm may attach to). The rail kit for the cable management arm may connect to the cable management arm via a pin connected through a connector of the cable management arm to a slide of the rail kit for the cable management arm. In another example, the support for the cable management arm may connect to the same rail kit of the computing device as the cable management arm attaches to. Additionally, the cable management arm may include at least one cable management arm extension.

Examples described herein, include a cable management arm comprising a first cable management arm to connect to a first connector of a first rail kit of a computing device and a second cable management arm to connect to a second connector of the first rail kit of the computing device. The first cable management arm may include a cable management arm extension. The second cable management arm may include a cable management arm extension. The cable management arm may also comprise a connector to pivotally attach to the first cable management arm and the second cable management arm. The cable management arm may also comprise a rail kit. The rail kit may comprise a retainer to connect to a connector of a second rail kit of the computing device. The retainer may also include a pivoting portion that pivots as the computing device and cable management arm are extended. The rail kit may comprise an inner slide and the inner slide may pivotally connect to the retainer (in other words, the inner slide may pivotally connect to the pivoting portion of the retainer). The rail kit may comprise an outer slide and the outer slide may be slidably connected to the inner slide. The rail kit may also comprise a short slide, slidably connected to the outer slide, to allow for a maximum range of motion. The cable management arm may allow for the computing device to be extended further from a rack than a standard cable management arm (for example, a cable management arm without a support or rail kit) may allow.

FIG. 1 is a block diagram of a cable management arm 100. The cable management arm 100 may comprise a first cable management arm 102 to connect to a first connector of a first rail kit of a computing device and a second cable management arm 104 to connect to a second connector of the first rail kit of the computing device. The cable management arm may also comprise a connector 106 to pivotally attach to the first cable management arm 102 and the second cable management arm 104. The cable management arm 100 may also comprise a rail kit 108. The rail kit 108 may comprise a retainer 110 to connect to a connector of a second rail kit of the computing device. The rail kit 108 may comprise an inner slide 112 and the inner slide 112 may pivotally connect to the retainer 110. The rail kit 108 may comprise an outer slide 114 and the outer slide 114 may be slidably connected to the inner slide 112. The rail kit 108 may pivotally attach to the connector 106 of the cable management arm 100 via a pin or other fastener.

As used herein, a "computing device" may be a storage array, storage device, storage enclosure, server, blade server, desktop or laptop computer, computer cluster, node, partition, or any other device or equipment including a controller, a processing resource, or the like. In examples described herein, a "processing resource" may include, for example, one processor or multiple processors included in a single computing device or distributed across multiple computing devices. As used herein, a "processor" may be at least one of a central processing unit (CPU), a semiconductor-based microprocessor, a graphics processing unit (GPU), a field-programmable gate array (FPGA) to retrieve and execute instructions, other electronic circuitry suitable for the retrieval and execution instructions stored on a machine-readable storage medium, or a combination thereof.

As used herein, "rack unit" or "U" may refer to the unit of measurement to define the height of a rack frame and the height of the equipment in a rack frame (such as, computing devices). Each rack unit may be equivalent to 44.50 millimeters or 1.75 inches. For example, a computing device, such as a rack server, may have a height of 2 U or 2 rack units (in other words, 89 millimeters or 3.5 inches).

As used herein, "forward" refers to an orientation that is aligned with a horizontal vector pointing from a rear of the bracket assembly toward a front of the bracket assembly, while "rearward" refers to an orientation that is aligned with a horizontal vector pointing from a front of the bracket assembly toward a rear of the bracket assembly. In FIGS. 2-8, "forward" is aligned with the +ŷ direction, while "rearward" is aligned with the −ŷ direction. When one of the example rail kits is installed in a device rack, the "forward" orientation may be aligned with a vector extending from a rear column of the device rack to a front column of the device rack, and vice-versa for the "rearward" orientation. Forward movement or extension is movement or extension in a forward oriented direction, whereas rearward movement or extension is movement or extension in a rearward oriented direction.

As used herein, "inward" refers to an orientation that is aligned with a vector that would point from the rail kit toward the electronic device if the electronic device were mounted to the rail kit. As used herein and in the appended claims, "outward" refers to an orientation that is the opposite of the "inward" orientation (i.e., an orientation that is aligned with a vector that would point away from the electronic device if the electronic device were mounted to the rail kit). "Inward" and "outward" for one rail kit will not necessarily be identical to "inward" and "outward" for another rail kit, since the different rail kits may be oriented differently from one another. For example, when a pair of rail kits is installed in a device rack, they may be facing each other, and thus "inward" for one of the rail kits may be pointing in an opposite direction as "inward" for the other one of the rail kits. For example, in FIGS. 2-8, "inward" is aligned with the +x̂ direction for the left-side rail kit 10L, and with the −x̂ direction for the right-side rail kit 10R. Similarly, "outward" is aligned with the −x̂ direction for the left-side rail kit 10L and the +x̂ direction for the right-side rail kit 10R. Inward movement or extension is movement or extension in an inward oriented direction, whereas outward movement or extension is movement or extension in an outward oriented direction.

As used herein, a first element may be to "couple" with a second element if the first element is capable of extending into an opening defined by the second element.

As used herein and in the appended claims, a first element is "connectable" to a second element if the first element is so configured that it is capable of being connected to the second element; however, this does not require that the first element actually be connected to the second element, For example, in the example rail kit the inner slide may not be connected to any electronic device initially, but the inner slide is nonetheless still "connectable" to an electronic device even in this state because the inner slide is so configured that it could be connected to an electronic device.

As used herein, a first element may be considered to "prevent movement" of a second element in some specified direction if the first element constrains the second element such that it cannot move in the specified direction beyond some point; however, this does not imply that the first element necessarily has to keep the second element from any and all movement in the specified direction. In other words, when it is said that some element "locks" another element, this does not mean that it completely prevents all movement of the element, but rather that it sets some constraint on movement. For example, when it is said that the first latch prevents the inner slide and middle slide from moving in both the forward direction and the rearward direction when it is in the locked position, this means that the first latch constrains the movement of the inner slide in the forward and rearward directions to be within some finite range of positions; however, the first latch does not necessarily prevent the inner slide and outer slide from all forward and rearward motion and the inner slide and middle slide may move forward and rearward freely within the finite range. This reflects the fact that some finite tolerance or "wiggle room" may be inevitable due to manufacturing variances. In addition, in certain examples some finite tolerance or "wiggle room" may be intentionally included in the design to facilitate smooth functioning of the locking mechanism.

As used herein and in the appended claims, a first element is "engagable" by a second element if the first element is so configured that it is capable of being engaged by the second element; however, this does not require that the first element actually be engaged by the second element. For example, in the example rail kit the inner slide may not be engaged by the middle slide initially, but the inner slide is nonetheless still "engagable" by the middle slide even in this state because the inner slide is so configured that it could be engaged by the middle slide.

FIG. 1, as noted above, is a block diagram of a cable management arm 100. In another example, the first cable management arm 102 and the second cable management arm 104 may include one or more cable loops. In another example, the first cable management arm 102 and second cable management arm 104 may include apertures or mounts to allow for mounting of cable loops. In another example, the first cable management arm 102 and the second cable management arm 104 may comprise a substantially flat component with a curve at the end connecting to the connector 106. In another example, the first cable management arm 102 and the second cable management arm 104 may be comprised of plastic, metal, or any other material suitable for computing device cable retention. In another example, the first cable management arm 102 and the second cable management arm 104 may be almost as long as the width of the computing device that the cable management arm 100 is attached to.

In another example, the first cable management arm 102 and/or second cable management arm 104 may comprise two separate sections. In such examples, the two sections may meet, engage, or connect at around the midpoint of a cable management arm extension. In a further example, the back side of the first cable management arm 102 and second cable management arm 104 (in other words, the side opposite where the cable management arm extension is located) may include a channel in one section and a rail attached to the other section, The rail may insert into the channel, when the two sections are adjacent or engaged. Upon extension of the cable management arm 100, the rail may extend out of the channel. In another example, a spring may connect the rail to the other section (in other words the section with the channel) of the first cable management arm 102 and second cable management arm 104. In such examples, upon retraction of the cable management arm 100, the spring may force the rail to snap back into the channel. In other word, the spring may provide an amount of tension to assist the cable management arm extension in returning back to shape.

As noted above, the first cable management arm 102 and/or the second cable management arm 104 may include a cable management arm extension. The cable management arm extension may be U-shaped. In another example, the cable management arm extension may be composed of a flexible material. In such examples, the cable management arm extension may be one piece. For example, as the cable management arm 100 extends and the first cable management arm 102 and the second cable management arm 104 are pulled out and apart, the sections of the first cable management arm 102 and the second cable management arm 104 may separate. During such an occurrence, the cable management arm extension (whether on the first cable management arm 102 or the second cable management arm 104) may flatten, thus allowing the cable management arm 100 to travel further. In another example, the cable management arm extension may be comprised of hinged sections and plates. In such examples, the cable management arm extension may include two hinged sections each connected to a section of the first cable management arm 102 or the second cable management arm 104. The hinged sections may also connect to a plate section. The plate section may include a cable loop, apertures to allow for installation of a cable loop, or other mounting components to allow for installation of a cable loop. In an example, the cable management arm extension may allow for the cable management arm 100 to extend further than normal. For example, a computing device may include an enclosure extension, thus lengthening the computing device. To access components within the computing device, a user may extend or pull the computing device further than normal. The cable management arm 100, with at least one cable management arm extension (included in either the first cable management arm 102 or second cable management arm 104), may support such a computing device and the extra distance the computing device may extend.

In another example, the connector 106 may be a C or U shaped component. In another example, the connector 106 may pivotally connect to the first cable management arm 102 and the second cable management arm 104 via hinge, latch, pin, some other means for physically or mechanically coupling or fastening physical components, or some combination thereof. The connection between the first cable management arm 102 and the connector 106 may allow the first cable management arm 102 to move outward from the connection. Additionally, the connection between the second cable management arm 104 and the connector 106 may allow the second cable management arm 104 to move outward from the connection. In another example, the connector 106 may include a stop or protrusion to prevent the first cable management arm 102 and/or second cable management arm 104 from moving inwards, in relation to the connection between the connector 106 and the first cable management arm 102 and/or second cable management arm 104.

In another example, the connector 106 may include a flat triangular or wedge shaped section. The section may be formed on or integral to the connector 106. The section of the connector may include an aperture, A portion of the rail kit 108 corresponding to the aperture of the section may include an aperture. In a further example, the outer slide 114 may include the aperture, while the inner slide 112 may not. In other words, the connector 106 may be pinned to the outer slide 114, but not the inner slide 112. In another example, the rail kit 108 may include a short slide. The short slide may slidably connect to the outer slide 114. In such examples, the connector 106 may pin or fasten to the short slide, rather than to the outer slide 114. In such examples, the outer slide 114 may not include an aperture. A pin or fastener may be inserted into the corresponding apertures and secured. In a further example, the pin or fastener may allow the connector 106 to pivot about the rail kit 108. Thus, as the cable management arm 100 extends the connector 106 may pivot about the rail kit 108, allowing the cable management arm 100 to move forward and towards the first rail kit of the computing device.

As noted above, the connector 106 may not connect directly to the outer slide 114. In such examples, the connector 106 may connect to a short slide. In such examples, the short slide may slidably connect to the outer slide 114. In such examples, the short slide may slide along the outer slide 114. In a retracted position the short slide and connector 106 may be located close to one side of the rack or, in other words, near the second rail kit of the computing device. As the computing device extends or pulls forward (in other words, pulls out from a rack), the short slide and connector 106 may travel up the outer slide 114. In a fully extended position, the short slide and connector 106 may be located near the first rail kit of the computing device. In such examples, the outer slide 114 may include a stop at one or both ends, to prevent the short slide from extending past the past the ends of the outer slide 114.

As noted above, additional support may be utilized for additional cabling (as in, the additional weight, amount, and/or length of cables). In addition, the cable management arm 100 may support a 1U computing device. In a further example, the 1U computing device may be longer than a typical 1U computing device. In such examples, longer cabling may be utilized to allow for the computing device to be pulled further out of a rack, thus allowing a user access to all components internal to the computing device. The rail kit 108 for the cable management arm 100 may add additional support and stability to the cable management arm 100. The rail kit 108 may follow the cable management arm 100 as the cable management arm 100 extends. In such examples, the rail kit 108 may attach to the connector 106. As the cable management arm 100 extends, the connector 106 and rail kit 108 may move forward or outward and towards the first rail kit of the computing device. Thus the rail kit 108 may support the first cable management arm 102, the second cable management arm 104, and the connector 106.

Figure 2:
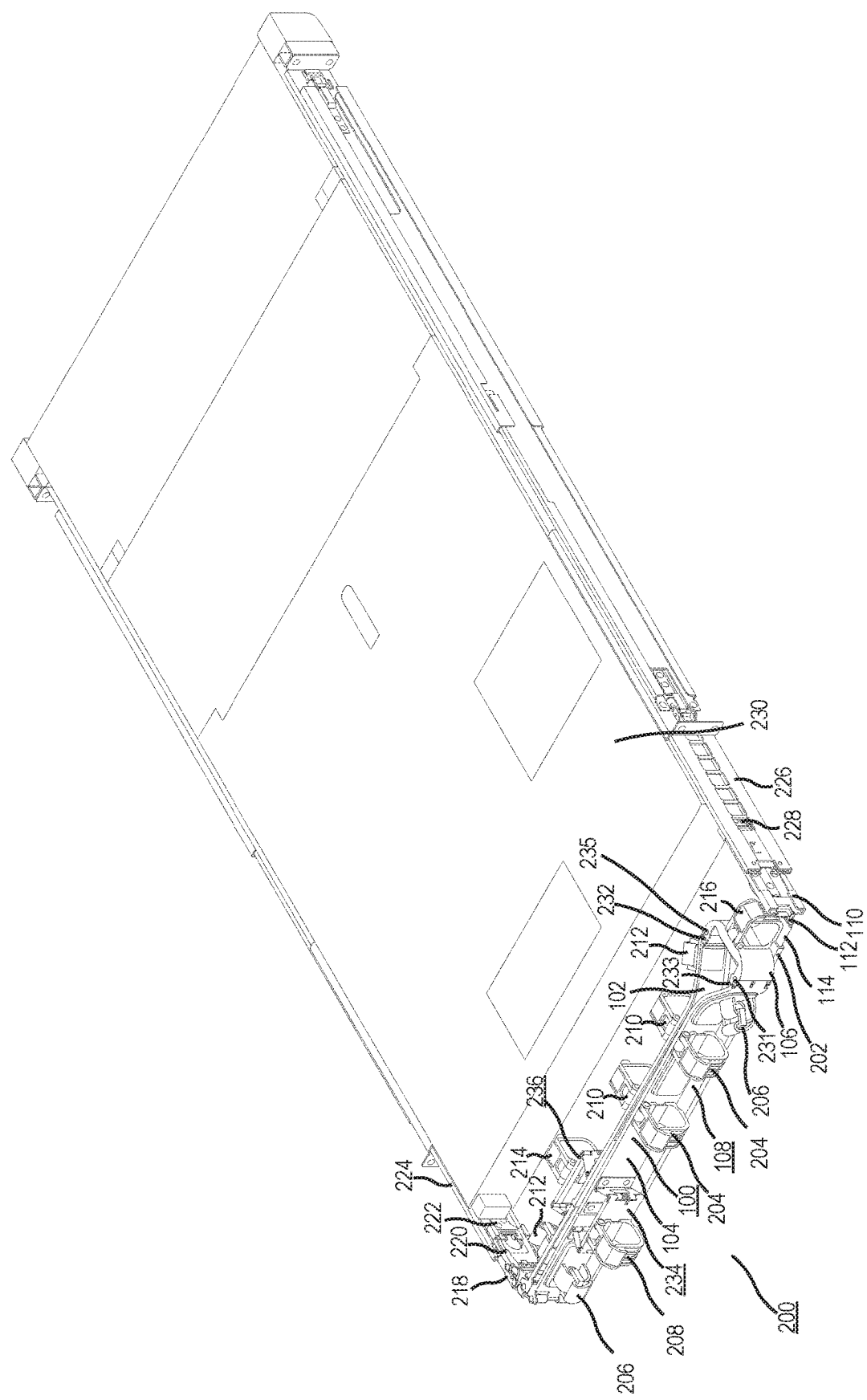
FIG. 2 is a schematic view of a cable management arm attached to a computing device, according to an example.

FIG. 2 is a schematic view of a cable management arm 100 attached to a computing device 230. In such examples, the cable management arm 100 may attach at the rear or back of the computing device 230. In an example, the cable management arm 100 may include a first cable management arm 102 and a second cable management arm 104. The first cable management arm 102 may pivotally connect to one end of connector 106, via pin 235, while the second cable management arm 104 may pivotally connect, via pin 231, to the other end of the connector 106. In such examples, the connector 106 may include stops or protrusions 232, 233 to prevent the first cable management arm 102 and the second cable management arm 104 from moving towards each other or inwards. For example, if a user attempts to push the first cable management arm 102 towards the second cable management arm 104, protrusion 232 may prevent the first cable management arm 102 from moving further than shown in FIG. 2 towards the second cable management arm 104.

In such examples, the other end of the first cable management arm 102 may include a latch 220 to connect to or engage with a first connector 222 of a first rail kit 224 of the computing device 230. Further, the other end of the second cable management arm 104 may include a latch 218 to connect to or engage with a second connector (not visible) of the first rail kit of the computing device 230, In such examples, the second connector of the first rail kit of the computing device 230 may remain stationary (as in, not move as the computing device 230 is extended/retracted), In another example, the first cable management arm 102 and the second cable management arm 104 may attach or connect to the second rail kit 226 of the computing device 230.

In another example, the connector 106 may connect to a rail kit 108. The rail kit 108 may include an inner slide 112, an outer slide 114, and a short slide 202. The connector 106 may connect to the outer slide 114 or, if present, the short slide 202. The short slide 202 may slidably connect to the outer slide 114. The inner slide 112 may slidably connect to the outer slide 114. In other words, the inner slide 112 may fit or insert into a channel of the outer slide 114. In another example, the inner slide 112 may pivotally connect to the retainer 110. In such examples the retainer 110 may connect to or engage with the connector 228 of the second rail kit of the computing device 230. In such examples, connector 228 of the second rail kit of the computing device 230 may remain stationary (as in, not move as the computing device 230 is extended/retracted). In such examples, the inner slide 112 of the rail kit 108 may pivotally attach to the connector 228 of the second rail kit 226. In another example, when the first cable management arm 102 and the second cable management arm 104 attaches or connects to the second rail kit 226 of the computing device 230, the retainer 110 may attach or connect to the first rail kit 224 of the computing device 230.

In FIG. 2, the computing device 230 and cable management arm 100 may be considered to be in a retracted, fully inserted, or installed position. In such a position, the cable management arm 100 may be closed. In other words, the first cable management arm 102 may be adjacent to and/or parallel (or substantially parallel) to the second cable management arm 104.

In another example, the first cable management arm 102 may include one or more cable loops 210, 212. In an example, the first cable management arm 102 may include rigid cable loops 210 and flexible cable loops 212. In another example, the first cable management arm 102 may include a cable management arm extension 236. In such examples, the cable management arm extension 236 may include a cable loop 214. In another example, the second cable management arm 104 may include one or more cable loops 204, 206. In an example, the second cable management arm 104 may include rigid cable loops 204 and flexible cable loops 206. In another example, the second cable management arm 104 may include a cable management arm extension 234. In such examples, the cable management arm extension 236 may include a cable loop 208.

Figure 3:
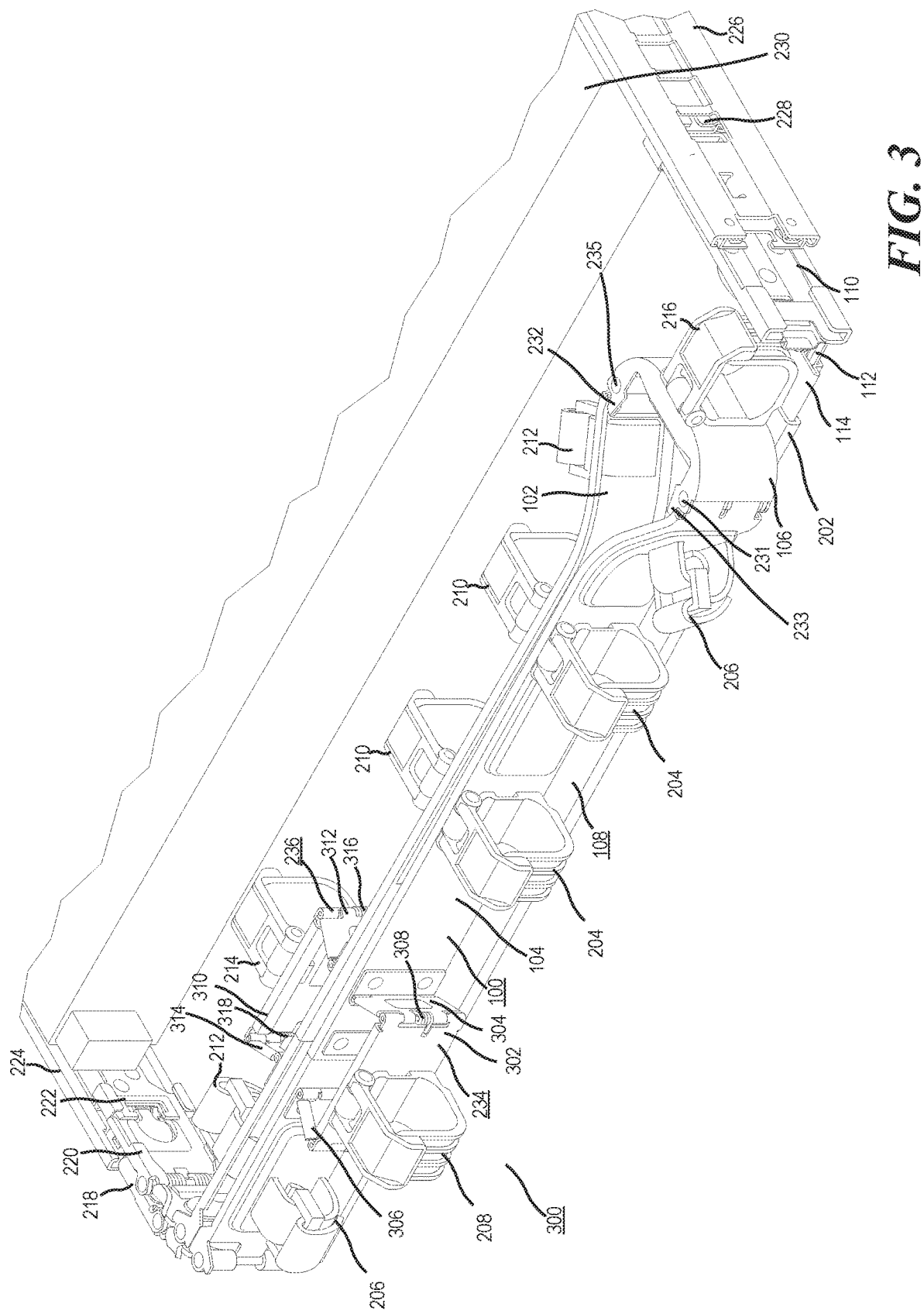
FIG. 3 is a close-up schematic view of a cable management arm attached to a computing device, according to an example.

FIG. 3 is a close-up schematic view of a cable management arm 100 attached to a computing device 230. As noted above, the first cable management arm 102 may include a cable management arm extension 236. In another example, the second cable management arm 104 may include a cable management arm extension 234. The cable management arm extension 234, 236 may include a first hinge 304, 312 fixedly connected, via pin or other fastener, to one of the first or second cable management arms 102, 104. The cable management arm extension 234, 236 may include a second hinge 306, 314 fixedly connected, via pin or other fastener, to one of the first or second cable management arms 102, 104. The first hinge 304, 312 and the second hinge 306, 314 may each hingedly connect to an end of a flat piece or plate 302, 310, thus forming the cable management arm extension 234, 236. In another example, the connection point between the first hinge 304 and plate 302 may include a spring 308 and the connection point between the second hinge 306 and plate 302 may include a spring (not visible), the springs to prevent the cable management arm extension 234 from over-extending or extending inwards. In another example, the spring 308 may provide tension to allow for the cable management arm extension 234 to return to shape upon retraction from an extended position. In another example, the connection point between the first hinge 312 and plate 310 may include a spring 316 and the connection point between the second hinge 314 and plate 310 may include spring 318, the springs to prevent the cable management arm extension 236 from over-extending or extending inwards. In another example, the spring 318 may provide tension to allow for the cable management arm extension 236 to return to shape upon retraction from an extended position. In an example, the flat piece or plate 302, 310 may include apertures or mounts to allow for mounting of cable loops (for example, cable loop 208, 214).

Figure 4:
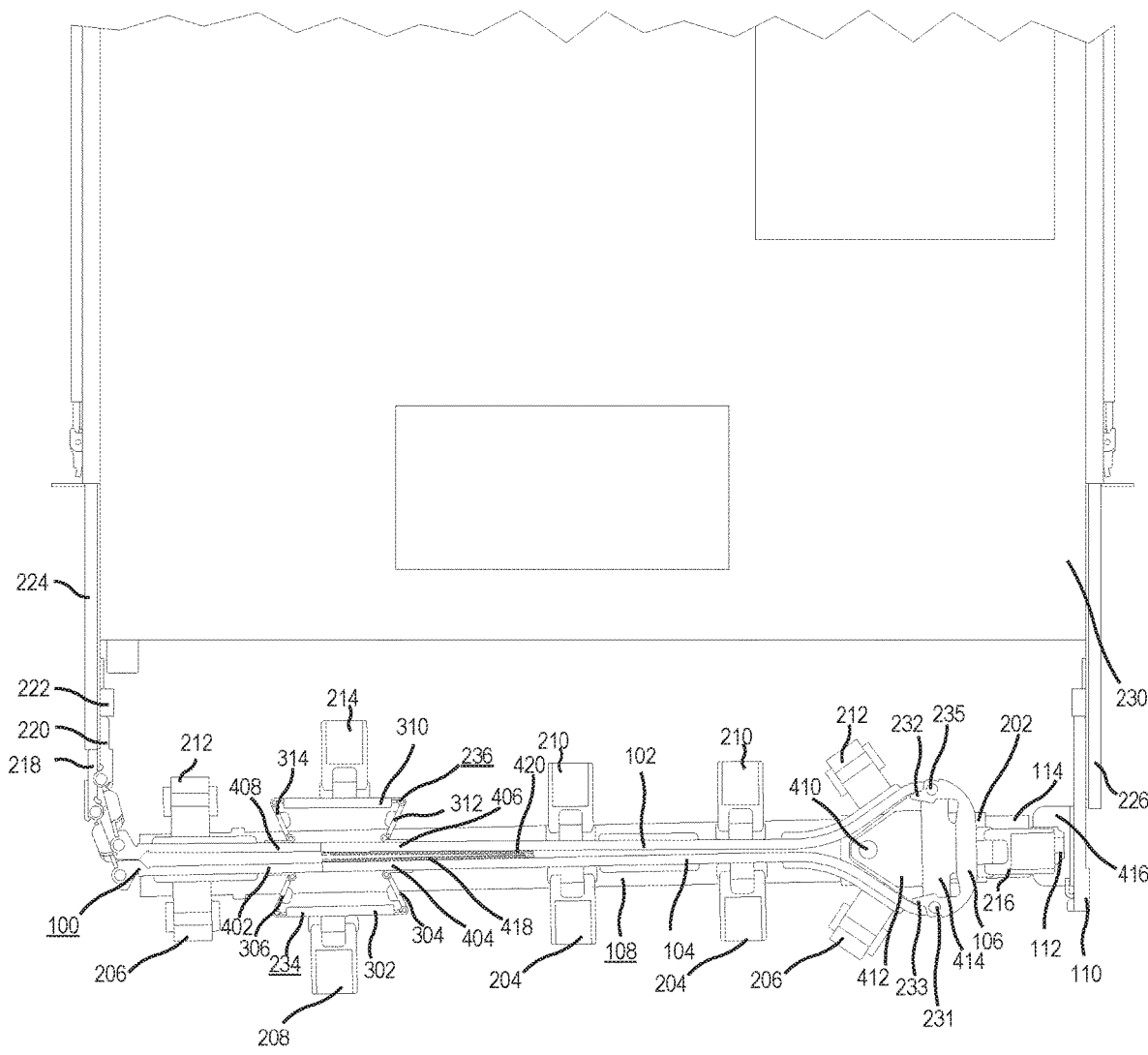
FIG. 4 is a top-down schematic view of a cable management arm attached to a computing device, according to an example.

FIG. 4 is a top-down schematic view of a cable management arm 100 attached to a computing device 230. As noted above the first cable management arm 102 and/or second cable management arm 104 may comprise two separate sections. The first cable management arm 102 may include a first section 406 and a second section 408. The second cable management arm 104 may include a first section 404 and a second section 402. In such examples, the first section 404, 406 may meet, engage, or connect to the second section 402, 408 at around the midpoint of a cable management arm extension 234, 236. In an example, the back side of the first section 404, 406 may include a channel. In an example, the back side of the second section 402, 408 may include a rail. The rail may insert into the channel, when the first section 404, 406 and the second section 402, 408 are adjacent. Upon extension of the cable management arm 100, the rail may extend out of the channel. In another example, a spring 418, 420 may connect the rail to the first section 404, 406. In such examples, upon retraction of the cable management arm 100, the spring 418, 420 may force the rail to snap back into the channel. In other word, the spring 418, 420 may provide an amount of tension to assist he cable management arm extension 234, 236 in returning back to shape.

As noted above, the connector 106 may include a flat triangular or wedge shaped lower section 412 and an upper section 414. The wedge shaped lower section 412 and upper section may be formed on or integral to the connector 106. The upper section 414 may extend out from the inside of the connector 106 and include a wall that connects the upper section 414 to the wedge shaped lower section 412. The wedge shaped lower section 412 of the connector may include an aperture. A short slide 202 of the rail kit 108 may include an aperture corresponding to the aperture of the wedge shaped lower section 412. A pin 410 or fastener may be inserted into the corresponding apertures and secured. In a further example, the pin 410 or fastener may allow the connector 106 to pivot about the rail kit 108.

As noted above, the inner slide 112 may pivotally connect to the retainer 110. In such examples, the retainer 110 may include a connecting portion 416 formed at the bottom edge of the retainer 110. In such examples, the inner slide 112 may pivotally connect to the connecting portion 416 of the retainer 110. Further, the inner slide 112 may pivotally connect to the connecting portion 416 to the retainer 110 via a pin or fastener.

Figure 5:
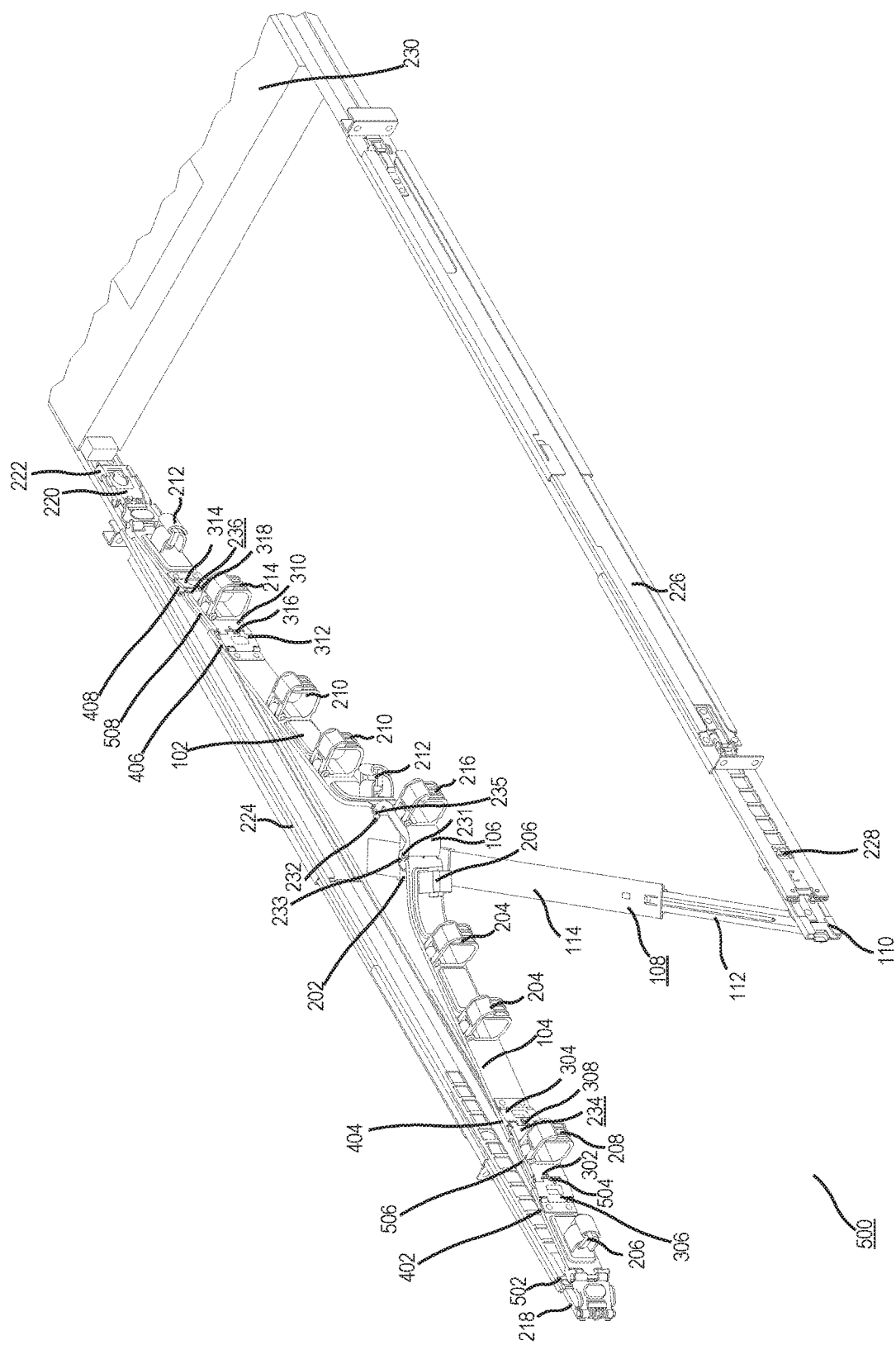
FIG. 5 is a schematic view of a cable management arm, in an extended position, attached to a computing device, according to an example.

FIG. 5 is a schematic view of a cable management arm 100, in an extended position, attached to a computing device 230. In an example, the computing device 230 may be longer and heavier than a normal computing device. In such examples, the computing device 230 may extend further than normal, to allow users to reach or access various components within the computing device 230. In such examples, a standard cable management arm may not extend far enough to allow for access to every component. Additionally, merely lengthening a cable management arm may not be sufficient, as lengthening a cable management arm may prevent the cable management arm from fitting into a rack. In FIG. 5, the cable management arm 100 may be extended further than a standard cable management arm. The cable management arm 100 may extend further and fit into a rack, based on the addition of the rail kit 108 underneath the cable management arm 100 supporting the additional weight and/or the addition of the cable management arm extensions 234, 236.

In another example, the other end of the second cable management arm 104 may include a latch 218 to connect to or engage with a second connector 502 of the first rail kit of the computing device 230. In such examples, the second connector 502 of the first rail kit of the computing device 230 may remain stationary (as in, not move as the computing device 230 is extended/retracted).

As noted above, the back side of the first section 404, 406 may include a channel. In an example, the back side of the second section 402, 408 may include a rail 506, 508. The rail 506, 508 may insert into the channel, when the first section 404, 406 and the second section 402, 408 are adjacent. Upon extension of the cable management arm 100, the rail 506, 508 may extend out of the channel.

Figure 6:
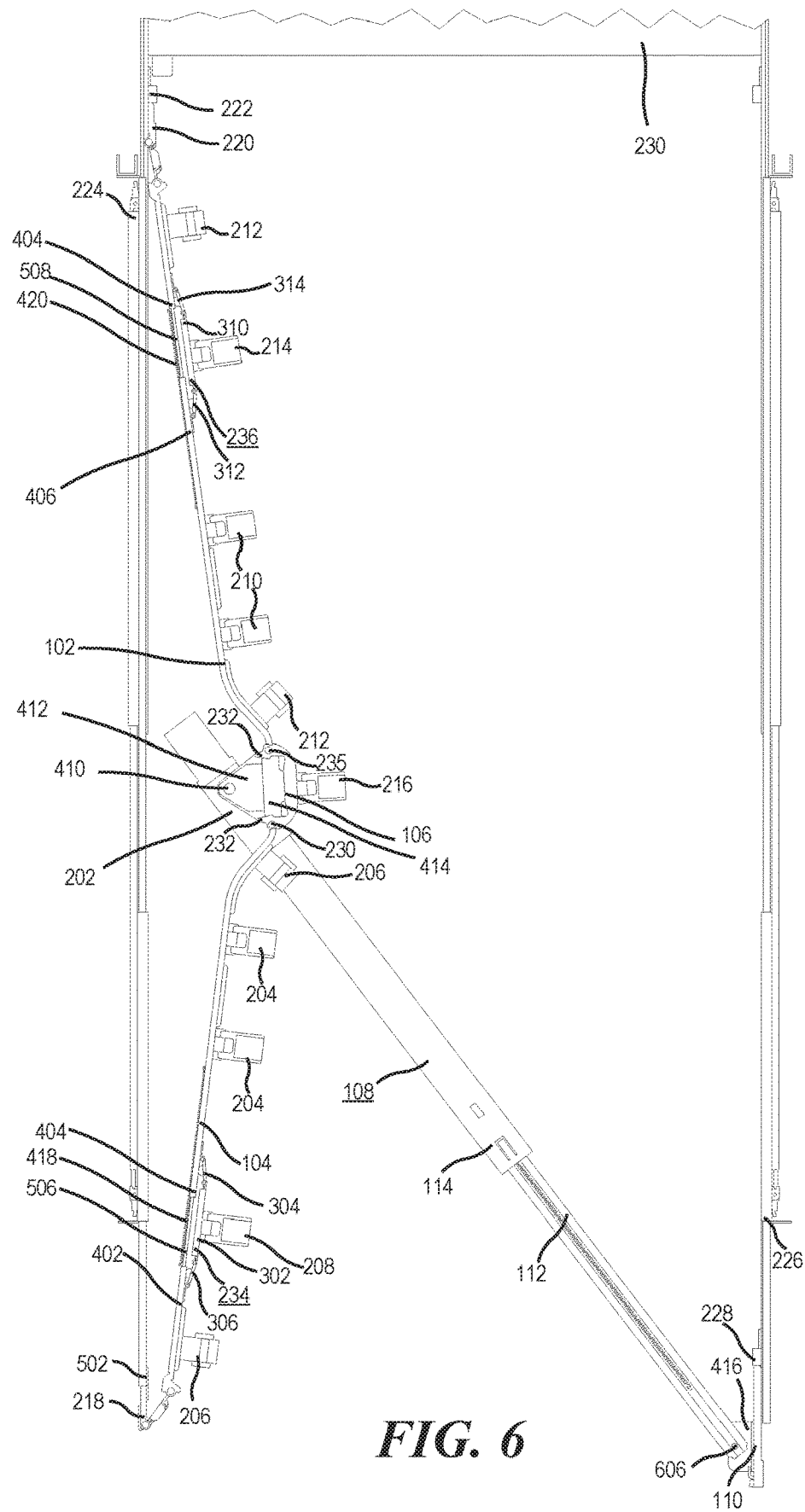
FIG. 6 is a top-down schematic view of a cable management arm, in an extended position, attached to a computing device, according to an example.

FIG. 6 is a top-down schematic view of a cable management arm 100, in an extended position, attached to a computing device 230. As noted above, the inner slide 112 may pivotally connect to the retainer 110. In such examples, the retainer 110 may include a connecting portion 416 formed at the bottom edge of the retainer 110. In such examples, the inner slide 112 may pivotally connect to the connecting portion 416 of the retainer 110. Further, the inner slide 112 may pivotally connect to the connecting portion 416 to the retainer 110 via a pin 606 or fastener.

Figure 7:
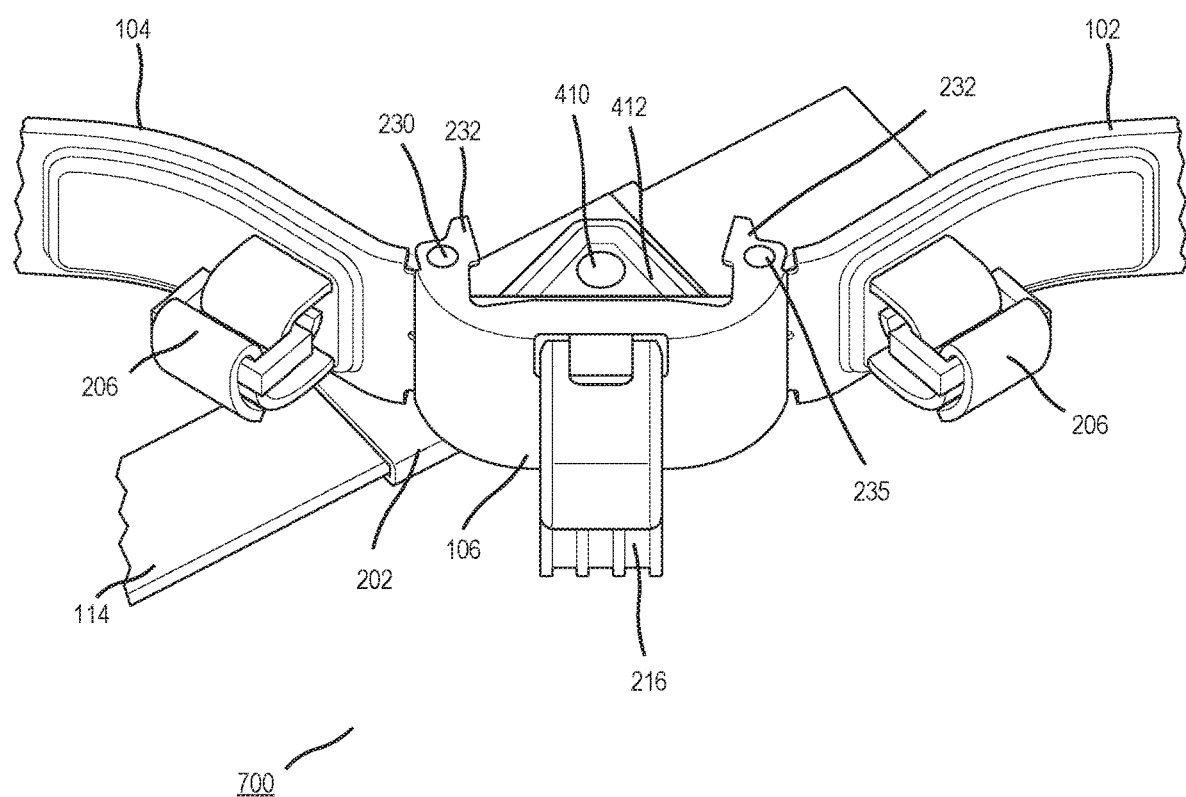
FIG. 7 is a schematic view of the connector, according to an example.

FIG. 7 is a schematic view of the connector 106. As noted above, the connector 106 may include a flat triangular or wedge shaped lower section 412 and an upper section 414. The wedge shaped lower section 412 and upper section may be formed on or integral to the connector 106. The upper section 414 may extend out from the inside of the connector 106 and include a wall that connects the upper section 414 to the wedge shaped lower section 412. The wedge shaped lower section 412 of the connector may include an aperture. A short slide 202 of the rail kit 108 may include an aperture corresponding to the aperture of the wedge shaped lower section 412. A pin 410 or fastener may be inserted into the corresponding apertures and secured. In a further example, the pin 410 or fastener may allow the connector 106 to pivot about the rail kit 108.

Figure 8:
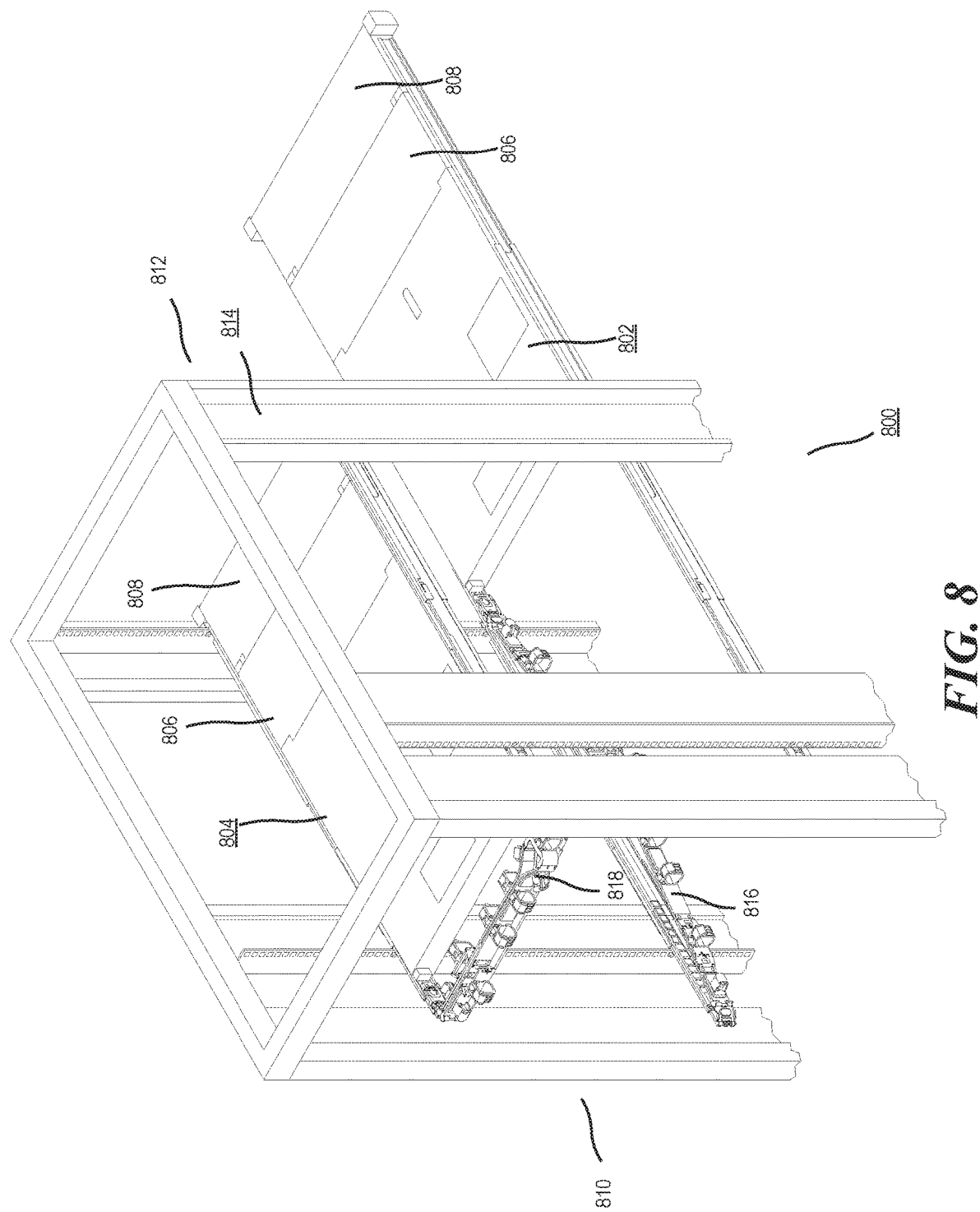
FIG. 8 is a schematic view of two computing devices, one retracted and one extended, in a rack, each with a cable management arm, according to an example.

FIG. 8 is a schematic view of two computing devices 802, 804, one retracted and one extended, in a rack 814, each with a cable management arm 816, 818. In an example, the computing devices 802, 804 may be rack servers. Further, the computing devices 802, 804 may be longer and/or heavier than normal. For example, computing device 802 and computing device 804 each may include two extra device cages 806, 808 (for example, drive cages). In such examples, a user may pull the computing device, from the front 812, out further than normal to access components towards the back 810 of the computing devices 802, 804. In an example, the computing device 802, 804 may include cable management arms 816, 818, as described above. In an example, the computing device 802 is in an extended position. In another example, the computing device 804 is in a retracted or installed position.

Figure 9:
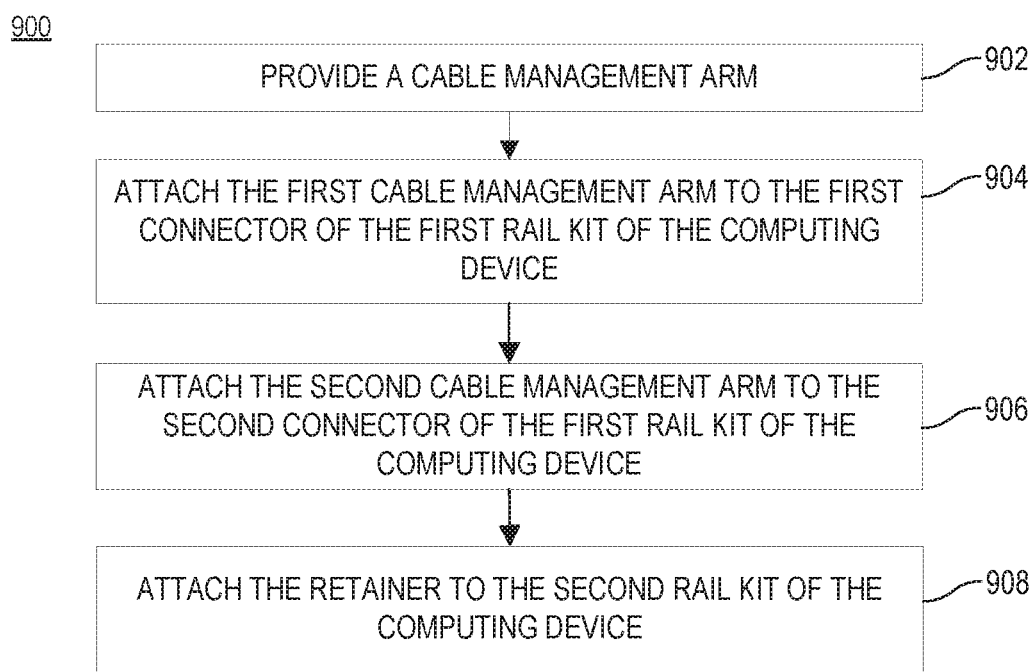
FIG. 9 is a method of attaching the cable management arm to a computing device, according to an example.

FIG. 9 is a method of attaching a cable management arm to a computing device. Although execution of method 900 is described below with reference to the cable management arm 100 and computing device 230 of FIG. 2, other suitable cable management arms and computing devices may be utilized. Additionally, implementation of method 900 is not limited to such examples. At block 902, a user may provide a cable management arm 100 for attaching to a computing device 230.

At block 904, the first cable management arm 102 may attach to the first connector 222 of the first rail kit 224 of the computing device 230. At block 906, the second cable management arm 104 may attach to the second connector of the first rail kit 224 of the computing device 230. At block 908, the retainer 110 may attach to a connector 228 of the second rail kit 226.

In another example, a user may attach cables to the computing device 230. In another example, the user may then pass the cables through the cable loops 210, 212, 214 or cable retainers of the first cable management arm 102. The user may then pass the cables through the cable loop 216, cable loops, or cable retainers of the connector 106. The user may then pass the cables through the cable loops 204, 206, 208 or cable retainers of the second cable management arm 104.

Although the flow diagram of FIG. 9 shows a specific order of execution, the order of execution may differ from that which is depicted. For example, the order of execution of two or more blocks or arrows may be scrambled relative to the order shown. Also, two or more blocks shown in succession may be executed concurrently or with partial concurrence. All such variations are within the scope of the present disclosure.

Figure 10:
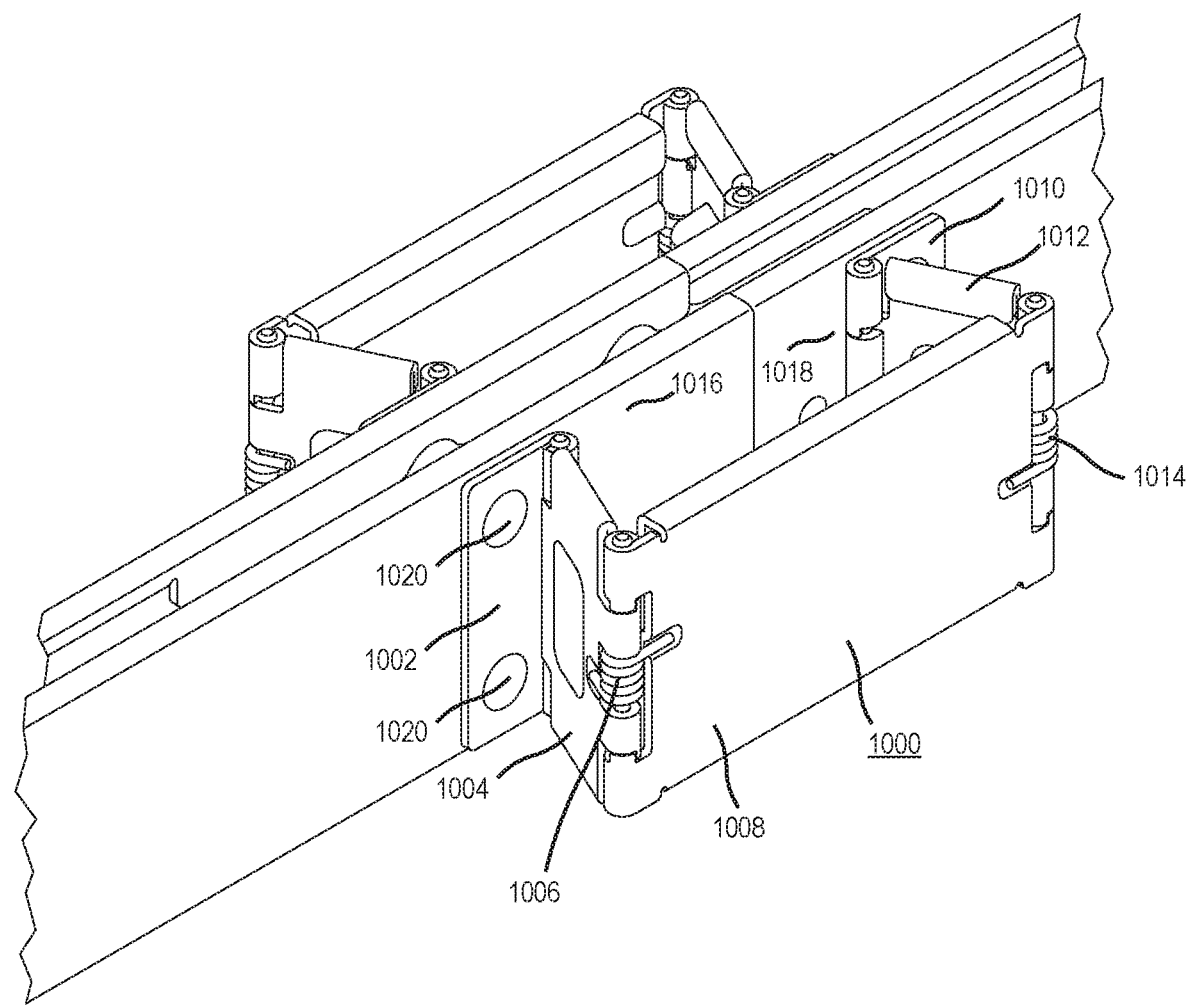
FIG. 10 is a close-up schematic view of a cable management arm extension, according to an example.

FIG. 10 is a close-up schematic view of a cable management arm extension 1000. As noted above, a first cable management arm and/or a second cable management arm may include a cable management arm extension 1000. In an example, the cable management arm extension 1000 may include a first hinge 1002, a second hinge 1004, a plate 1008, a third hinge 1010, and a fourth hinge 1012. The first hinge 1002 and the third hinge 1010 may include two apertures 1020, to allow pins or fasteners. Further, the first hinge 1002 and the third hinge 1010 may be connected to a first section 1016 and a second section 1018 of the cable management arm, respectively. In such examples, the first hinge 1002 and the third hinge 1010 may be staked, pinned, or fixedly connected to the first section 1016 and the second section 1018 of the cable management arm extension, respectively. In another example, the first hinge 1002 and the third hinge 1010 may be hingedly connected to the second hinge 1004 and the fourth hinge 1012, respectively. In another the second hinge 1004 and the fourth hinge 1012 may each hingedly connect to the plate 1008. In another example, a first spring 1006 and a second spring 1014 may be included between the hinged connection of the second hinge 1004 and the plate 1008 and between the hinged connection of the fourth hinge 1012 and the plate 1008, respectively. The first spring 1006 and the second spring 1014 may provide tension to assist the cable management arm extension 1000 to return to shape upon retraction from an extended position. In another example, the plate 1008 may include apertures (not shown) or mounts (not shown) to allow for a cable loop to be installed. First section 1016 and second section 1018 may be on a same plane and may remain on the same plane both in the retracted position depicted in FIG. 10 and in the extended position depicted below in FIG. 11.

Figure 11:
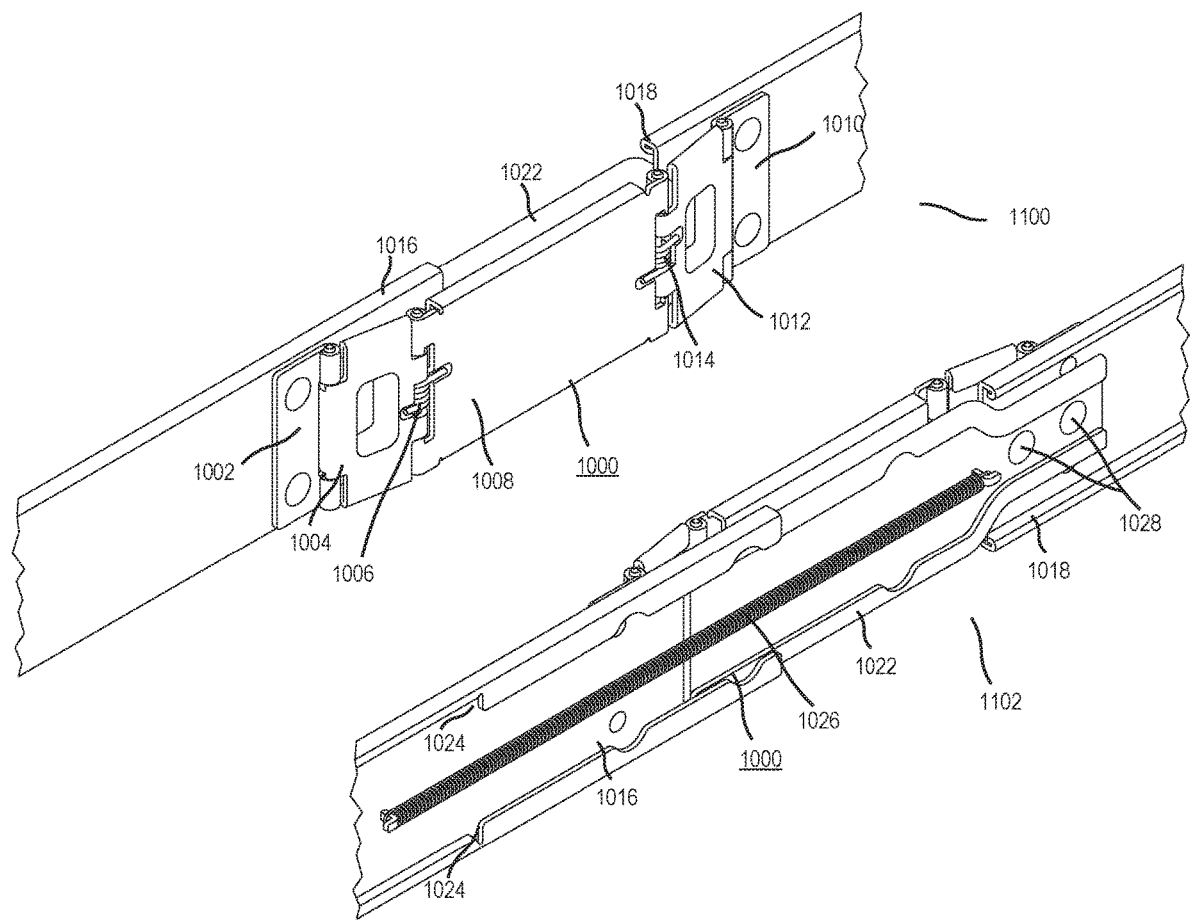
FIG. 11 is a close-up schematic view of the front and back of an extended cable management arm extensions, according to an example.

FIG. 11 is a close-up schematic view of the front 1100 and back 1102 of an extended cable management arm extension 1000. In an example, along the back of the first section 1016 of the cable management arm extension 1000 a channel 1024 may be formed. In another example, the back of the second section 1018 of the cable management arm extension 1000 may include a rail 1022. In such examples, the rail 1022 may be fixedly attached or connected, via pins 1028 or other fasteners, to the back of the second section 1018 of the cable management arm extension 1000. In such examples, the rail 1022 may fit into or engage with the channel 1024. In another example, the rail 1022 may include a spring 1026. In a further example, the spring 1026 may connect to one end of the rail 1022 and the back of the first section 1016 of the cable management arm extension 1000. In such examples, upon retraction of the cable management arm extension 1000, the spring 1026 may force the rail 1022 to snap back into the channel 1024. In other word, the spring 1026 may provide an amount of tension to assist the cable management arm extension 1000 in returning back to shape.

Figure 12:
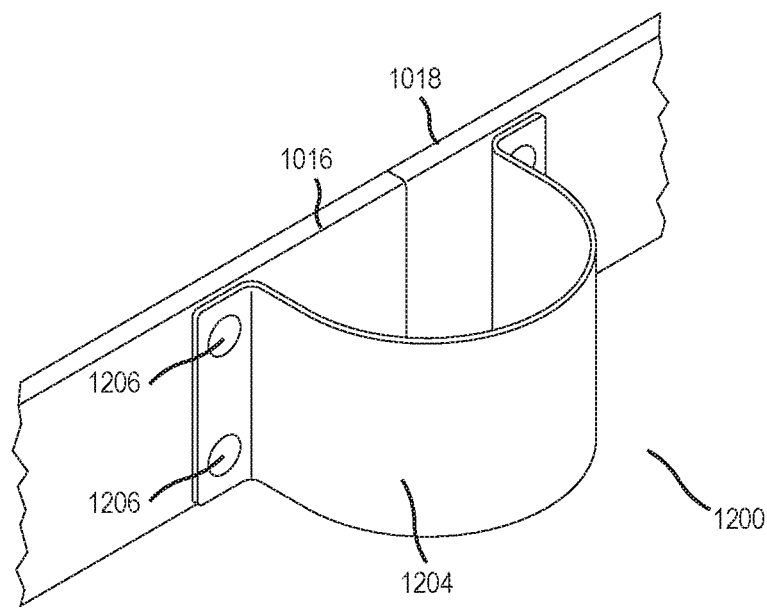
FIG. 12 is a close-up of another retracted and extended cable management arm extension, according to an example.
Figure 12:
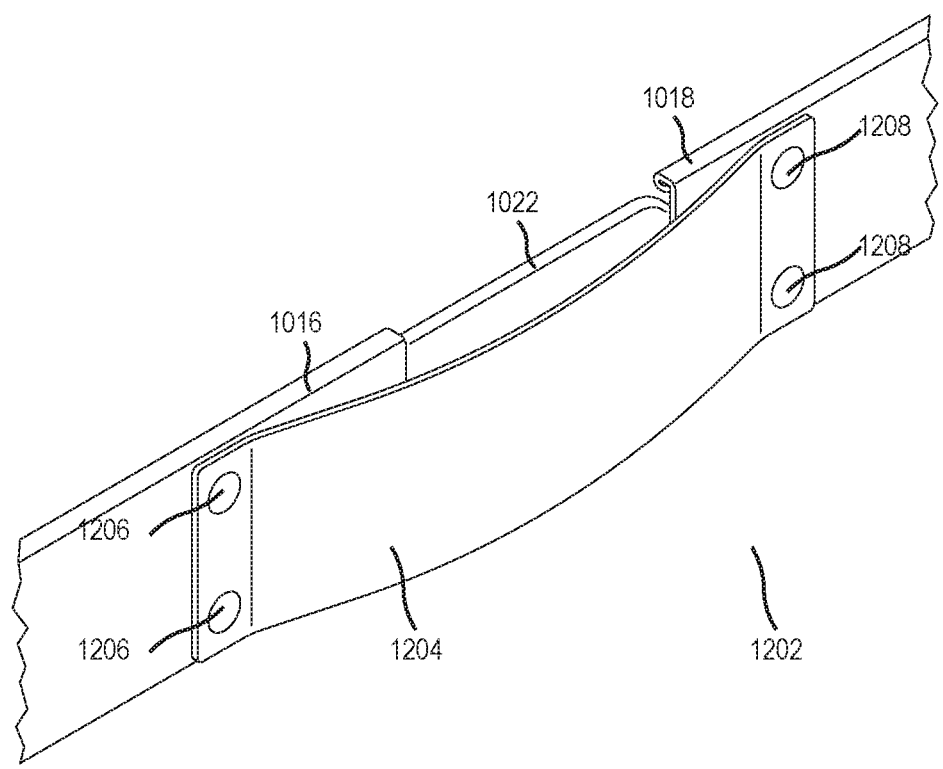

FIG. 12 is a close-up of another retracted cable management arm extension 1200 and extended cable management arm extension 1202. In an example, rather than a plate and hinges, the cable management arm extension may include a flexible bridge 1204 and pins 1206, 1208. In such an example, each end of the flexible bridge 1204 may be pinned to the first section 1016 and the second section 1018 of the cable management arm extension. In such examples, the flexible bridge may provide an amount of tension to assist with pulling the cable management arm extension back together from an extended position 1202 to a retracted position 1200.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be examples. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. A cable management arm assembly, comprising:
a cable management arm having a first section and a second section, wherein the first section has a first back portion which defines a channel to accept a rail and the second section has a second back portion which includes the rail, the rail being attached to the second back portion of the second section, wherein the first section and the second section are on a same plane; and
a cable management arm extension, the cable management arm extension including:
a plate defining a plurality of cable retainer mounting apertures and having a first side and a second side;
a first hinged section connected to the first section of the cable management arm and to the first side of the plate; and
a second hinged section connected to the second section of the cable management arm and to the second side of the plate,
wherein in an extended position, the first section and the second section are not abutted, are connected by the rail, and remain on the same plane, wherein the rail includes a spring connected to an end of the rail and to the first back portion of the first section, and
wherein in a retracted position, the rail is inserted into the channel in the first back portion of the first section of the cable management arm, and the first section of the cable management arm and the second section of the cable management arm remain on the same plane and are abutted by the spring forcing the rail to fit into the channel.

2. The cable management arm assembly of claim 1, wherein:
the first hinged section includes a first connection point;
the second hinged section includes a second connection point;
a first spring is included between the first connection point of the first hinged section and the plate; and
a second spring is included between the second connection point of the second hinged section and the plate.

3. The cable management arm assembly of claim 2, wherein the first spring and the second spring prevent the plate from folding inwards.

4. The cable management arm assembly of claim 2, wherein the first spring and the second spring assist the plate in returning to the retracted position.

5. A cable management arm assembly, comprising:
a cable management arm having a first section and a second section, wherein the first section has a first back portion which defines a channel to accept a rail and the second section has a second back portion which includes the rail, the rail being attached to the second back portion of the second section, wherein the first section and the second section are on a same plane; and
a flexible bridge, the flexible bridge including:
a first connecting end connected to the first section of the cable management arm; and
a second connecting end connected to the second section of the cable management arm,
wherein the flexible bridge pulls the first connecting end and the second connecting end to move inwards and return the cable management arm extension to a retracted position,
wherein in the retracted position, the rail is inserted into the channel in the first back portion of the first section of the cable management arm, and the first section of the cable management arm and the second section of the cable management arm remain on the same plane and are abutted, and
wherein in an extended position, the first section and the second section are not abutted, are connected by the rail, and remain on the same plane.

6. The cable management arm assembly of claim 5, wherein the flexible bridge allows the cable management arm to be extended to the extended position from the retracted position and then returned to the retracted position.

7. The cable management arm assembly of claim 5, wherein the flexible bridge forms a semi-circle when in the retracted position and is about parallel to the cable management arm when in the extended position.

8. The cable management arm assembly of claim 5, wherein the flexible bridge defines a plurality of cable retainer mounting apertures.

9. The cable management arm assembly of claim 8,
further comprising at least one cable retainer mounted using the cable retainer mounting apertures; and
wherein the at least one cable retainer comprises a flexible material.

10. A cable management arm assembly, comprising:
a first cable management arm to connect to a first connector of a first rail kit of a computing device, the first cable management arm having a first section and a second section and including a first cable management arm extension, the first cable management arm extension including:
a first plate having a first side and a second side and defining a plurality of first cable retainer mounting apertures;
a first hinged section connected to the first section of the first cable management arm and to the first side of the first plate; and
a second hinged section connected to the second section of the first cable management arm and to the second side of the first plate,
wherein the first plate:
pushes the first hinged section and the second hinged section to turn outwards to separate the first section of the first cable management arm and the second section of the first cable management arm from one another and hold the first cable management arm extension in an extended position, and
pulls the first hinged section and the second hinged section to turn inwards to connect the first section of the first cable management arm and the second section of the first cable management arm with one another and return the first cable management arm extension to a retracted position;
a second cable management arm to connect to a second connector of the first rail kit of the computing device, the second cable management arm having a third section and a fourth section and including a second cable management arm extension, the second cable management arm extension including:
a second plate having a first side and a second side and defining a plurality of second cable retainer mounting apertures;
a third hinged section connected to the third section of the second cable management arm and to the first side of the second plate; and
a fourth hinged section connected to the fourth section of the second cable management arm and to the second side of the second plate,
wherein the second plate:
pushes the third hinged section and the fourth hinged section to turn outwards to separate the third section of the second cable management arm and the fourth section of the second cable management arm from one another and hold the second cable management arm extension in an extended position, and
pulls the third hinged section and the fourth hinged section to turn inwards to abut connect the third section of the second cable management arm and the fourth section of the second cable management arm with one another and return the second cable management arm extension to a retracted position; and
a connector pivotally attached to the first cable management arm and the second cable management arm.

11. The cable management arm assembly of claim 10, wherein:
the first section of the first cable management arm has a first back portion; and
the first back portion of the first section of the first cable management arm includes a channel to accept an inner slide.

12. The cable management arm assembly of claim 11, wherein:
the second section of the first cable management arm has a second back portion; and
the second back portion of the second section of the first cable management arm includes the inner slide.

13. The cable management arm assembly of claim 12, wherein the inner slide is separate from the first cable management arm and staked to the second back portion of the second section of the first cable management arm.

14. The cable management arm assembly of claim 12, wherein, in the retracted position, the cable management arm extension is retracted, the inner slide is inserted into the channel in the first back portion of the first section of the first cable management arm, and the first section of the first cable management arm and the second section of the first cable management arm are abutted.

15. The cable management arm assembly of claim 14, wherein a spring is attached to one end of the inner slide and the first back portion of the first section of the first cable management arm.

16. The cable management arm assembly of claim 15, wherein the spring allows the first section of the first cable management arm and the second section of the first cable management arm to pull back to the retracted position when the computing device is moved from an extended position from a rack to fully inserted into the rack.

17. The cable management arm assembly of claim 16, wherein, in the extended position, the cable management arm extension is fully extended, the inner slide is, at least partially, out of the channel, and a gap is formed between the first section of the first cable management arm and the second section of the first cable management arm.

18. The cable management arm assembly of claim 10 wherein the first cable management arm includes a plurality of cable management arm extensions.

* * * * *